United States Patent [19]

Gaughan

[11] Patent Number: 4,689,098

[45] Date of Patent: Aug. 25, 1987

[54] MOLDING COMPOSITION

[75] Inventor: Roger G. Gaughan, Bartlesville, Okla.

[73] Assignee: Phillips Petroleum Company, Bartlesville, Okla.

[21] Appl. No.: 786,573

[22] Filed: Oct. 11, 1985

[51] Int. Cl.$^4$ .......................... B32B 15/14; B32B 17/06
[52] U.S. Cl. .................................. 156/62.2; 156/279; 428/285; 428/344
[58] Field of Search ............... 428/285, 344; 156/62.2, 156/279

[56] References Cited

U.S. PATENT DOCUMENTS

| | | | |
|---|---|---|---|
| 2,979,424 | 4/1961 | Whitehurst et al. | 117/227 |
| 3,041,131 | 6/1962 | Juras et al. | 18/47 |
| 3,167,427 | 1/1965 | Slayter | 75/201 |
| 3,184,368 | 5/1965 | Juras | 161/157 |
| 3,356,559 | 12/1967 | Juras | 161/5 |
| 3,356,914 | 12/1967 | Juras | 161/5 |
| 3,521,214 | 7/1970 | Bennett et al. | 338/322 |
| 3,577,295 | 5/1971 | Kraft et al. | 156/177 |
| 3,578,544 | 5/1971 | Thorsrud | 161/59 |
| 3,609,104 | 9/1971 | Ehrreich | 252/511 |
| 3,649,438 | 3/1972 | Walker et al. | 161/162 |
| 3,708,387 | 1/1973 | Turner et al. | 61/168 |
| 3,775,365 | 11/1973 | Mathis et al. | 260/41 R |
| 3,781,170 | 12/1973 | Nakao et al. | 29/182.5 |
| 3,836,422 | 9/1974 | Bischoff | 428/285 |
| 3,988,286 | 10/1976 | Edmonds et al. | 260/37 R |
| 3,992,160 | 11/1976 | Marzocchi et al. | 29/182.5 |
| 4,042,569 | 8/1977 | Bell et al. | 260/75 T |
| 4,044,188 | 8/1977 | Segal | 428/283 |
| 4,215,084 | 7/1980 | Maringer | 264/8 |
| 4,216,423 | 8/1980 | Davenport | 320/1 |
| 4,227,037 | 10/1980 | Layton | 174/35 |
| 4,229,328 | 10/1980 | Makino et al. | 260/16 |
| 4,234,648 | 11/1980 | Patz et al. | 428/245 |
| 4,243,460 | 1/1981 | Nagler | 156/275 |
| 4,247,594 | 1/1981 | Shea et al. | 428/328 |
| 4,276,397 | 6/1981 | Froix | 525/448 |
| 4,281,284 | 7/1981 | Stutz et al. | 324/58 A |
| 4,332,853 | 6/1982 | Hornbeck et al. | 428/371 |
| 4,356,228 | 10/1982 | Kobayashi et al. | 428/283 |
| 4,375,493 | 3/1983 | George et al. | 428/285 |
| 4,378,322 | 3/1983 | Atterbury | 264/24 |
| 4,379,098 | 4/1983 | Gumienny | 264/24 |
| 4,383,942 | 5/1983 | Davenport | 252/512 |
| 4,388,422 | 6/1983 | Gerteisen et al. | 523/137 |
| 4,389,453 | 6/1983 | Kitanaka et al. | 428/285 |
| 4,399,084 | 8/1983 | Sagawa et al. | 264/27 |
| 4,404,125 | 9/1983 | Abolins et al. | 252/511 |
| 4,429,216 | 1/1984 | Brigham | 219/528 |
| 4,442,139 | 4/1984 | Brigham | 427/122 |
| 4,461,860 | 7/1984 | Vives | 524/80 |
| 4,474,685 | 10/1984 | Annis | 252/503 |
| 4,495,017 | 1/1985 | Abe et al. | 156/181 |
| 4,542,056 | 9/1985 | Anglin et al. | 428/285 |

FOREIGN PATENT DOCUMENTS

| | | | |
|---|---|---|---|
| 3236447 | 4/1984 | Fed. Rep. of Germany | 428/285 |
| 56-27344 | 3/1981 | Japan | 428/285 |

OTHER PUBLICATIONS

Modern Plastics, May 1982, p. 68—"Conductive Fiber Mats as EMI Shield for SMC" Quick & Mate.
Plastics Compounding, Jan.–Feb. 1980, "Electrically Conductive Fillers and Reinforcements", p. 19.
Industrial Research & Development, Jun. 1982, "EMI Shielding can be made of Conductive Plastics", Simon.
Plastics Technology, Sep. 1983, p. 59: EMI/RFI Shield Deadline Looms: Here's Composite Source Guide—Kirkland.
Advanced Ryton Composites (published Jan. 1984) by Phillips Petroleum Company.
Modern Plastics, Oct. 1984, p. 62, "Conductive Fillers Yield EMI Shielding Gains".
LNP Corporation "Electrically Conductive Plastics", Materials Engineering, Feb. 1980, Crosby & Theberge.
Dow: Formable Metallized Plastic: Form No. 500-93-0-84.
Plastics Engineering, Jun. 1981, p. 29: Formulating Cost-effective Conductive Composites, Fowler et al.
Electrafil-Electrically Conductive Thermoplastics, Wilson-Fiberfil Internat., Dart & Kraft ©Dart 1983.
Metalloplastics, Don Davenport, PhD, San Ramon, Calif. 94583.

Primary Examiner—Benoit Castel
Attorney, Agent, or Firm—John R. Casperson

[57] ABSTRACT

EMI shielded stampable sheet contains two fiber mats, one of which provides primarily reinforcing function, the other of which provides primarily EMI shielding function.

19 Claims, No Drawings

Whisker diameter is not particularly important provided that the whisker is not so fragile as to be broken during the thermoforming process. For economy, the whiskers should be of relatively small diameter, preferably in the range of 0.01 to 1 millimeter. Suitable whisker length ranges from 1 millimeter to continuous strand. Preferably, each whisker has a length of greater than 1 centimeter to provide a high aspect ratio and good effectiveness for EMI shielding. Preferably, a major portion of the whiskers have a length in the range of 0.5 to 20 centimeters, more preferably in the range of 1 to 10 centimeters, for ease of processing and most desirable shielding properties. Diameters of the whiskers are preferably in the range of from 0.05 millimeters to 0.5 millimeters although whiskers of other dimensions will work. A preferred metal whisker is comprised of aluminum. Whiskers of this type are formed by the Transmet Corp. (Columbus, Ohio) by distributing molten aluminum on a rapidly spinning wheel followed by a rapid quenching.

The polymer used to form a resin matrix around the first layer and second layer of the fibers can be either thermoplastic or thermoset resin. Polyethylene, polypropylene, and polyester resins are believed highly suitable where high performance properties are not required. Other suitable resins include polystyrene, ABS, other acrylic polymers and copolymers polyethers, polyamides, PVC (polyvinylchlorides), polycarbonates, epoxy resins, phenolic resins, melamines and polyarylene sulfides such as polyphenylene sulfide, polyphenylene sulfide sulfone, polyphenylene sulfide ketone, polyphenylene ether ketone, polyphenylene ether polyphenylsulfone and the like. Almost any polymer which is suitably strengthened by incorporating glass mat can be made into a conductive composite by the inclusion of glass mat on which is deposited a conductive amount of aluminum fiber.

The relative amounts of polymer matrix, reinforcing fiber, and shielding fiber can vary depending upon the reinforcing and shielding properties desired. Generally, the two layer mat can be formed with a weight ratio of reinforcing fiber, generally glass, to metal whiskers such as aluminum, in the range of 4:1 to 1:1. It is believed that by providing the mat with a ratio of glass fiber to aluminum in the range of 3:1 to 1:1 on a weight basis will provide very good results for most applications. The amount of polymer in the composite will generally range from about 25 to 75 percent by weight. A polymer content in the composite ranging from about 40 to 60 percent by weight will provide good results in the case of engineering thermoplastics. Greater amounts of inexpensive polymer such as polypropylene can be used in applications where the mechanical properties are adequate. It is a relatively simple matter when using the invention to attain EMI shielding of at least 40 decibels (dB) and EMI shielding of at least 50 dB such as in the range 50 to 70 dB can be attained without undo experimentation.

To form the conductive mat of the present invention, the nonwoven reinforcing fabric can be passed beneath a distributor of metal whiskers and the metal whiskers are distributed onto the mat from the distributor in an amount sufficient to impart the desired conductivity to the mat. Entanglement between layers can be avoided by interspersing layers of paper of film, such as a film of the polymer to be used as the matrix, between layers of conductive mat in the stack or on the roll. Good results are expected where the glass fibers are continuous and the metal whiskers have a length in the range of 0.5 to 20 centimeters and are distributed on the nonwoven mat in an amount sufficient to impart to the resulting 2-layer conductive mat in the range of 25 to 50 weight percent metal. In a preferred embodiment of the invention, a major portion of the metal whiskers have length in the range of 1 to 10 centimeters.

EMI shielded stampable sheet can be formed on a compaction line in accordance with the invention simply by substituting the conductive mat for the nonconductive mat normally used in such applications. The conductive mat is sandwiched between films of polymer and subjected to sufficiently elevated conditions of temperature and pressure to form the stampable sheet. To form EMI shielded stampable sheet from thermo setting materials the conductive mat is passed through a bath of the thermo setting resin, withdrawn and allowed to partially cure.

The invention is illustrated by the following example:

EXAMPLE 1

Continuous glass fiber mat (Owens-Corning Fiberglass OCF M-8608) was pressed in a laminate with polyphenylene sulfide (PPS) at 600° F. for 1.5 minutes at contact pressure and then at 100 psi and 600° F. for 2 minutes followed by 3 minutes at 100 psi in a room temperature press. Properties of the laminate are shown in Table I.

EXAMPLE 2

PPS-Glass Fiber-Aluminum Fiber Composites

Aluminum fiber (0.75-inch; Transmet Corp., Columbus, Ohio) was placed between layers of continuous glass fiber mat (OCF M-8608) at the desired weight level and laminated with PPS as in Example I. Properties of the laminates at various ratios of glass and aluminum to polymer are shown in Table I.

Comparisons of the data show that EMI shielding varies in relation concentration of the aluminum fiber but as the aluminum fiber content increases from 5 to 20 percent and simultaneously the glass fiber content decreases from 35 to 20 percent, the impact strength (notched Izod) decreases from 16.7 to 11.8 ft.-lb/inch. A good balance of properties is obtained in a composite comprised of 33 percent glass, 17 percent aluminum fibers and 50 percent PPS. Raising the glass fiber content to 40 percent and the aluminum to 20 percent provides a small increase in EMI shielding but at the expense of a distinct reduction of impact strength.

TABLE I

| Properties of Polyphenylene Sulfide (PPS)—Glass Fibers - Aluminum Fibers Composites | | | | | | | | |
|---|---|---|---|---|---|---|---|---|
| Glass Fibers (%) | 40 | 35 | 30 | 25 | 20 | 33 | 40 | 32 |
| Al° Fibers (%) | 0 | 5 | 10 | 15 | 20 | 17 | 20 | 18[a] |
| Resin (%) | 60 | 60 | 60 | 60 | 60 | 50 | 40 | 50 |
| Tensile Strength[c] ($\times 10^3$ psi) | 23 | 23.6 | 24.8 | 17.2 | 16.9 | 22.5 | 22.1 | 9.6 |
| Flexural Strength[d] ($\times 10^3$ psi) | 34.5 | 40.9 | 39.8 | 40.5 | 29.5 | 40.2 | 32.5 | 17.8 |

MOLDING COMPOSITION

BACKGROUND OF THE INVENTION

In one aspect, the invention relates to a fiber mat suitable for incorporating into a molding composition. In another aspect, the invention relates to a process for forming the fiber mat. In yet another aspect, the invention relates to molding composition containing the fiber mat.

For many applications, it is desirable to provide finished parts with electromagnetic interference (EMI) shielding characteristics. In the automotive field, EMI shielding is required for plastic hoods, fenders, and fire walls. Office business machines require some form of shielding over parts of their internal areas. By regulation, emissions from all digital computing devices must be within certain radiation limits. Regulation of emissions is necessary because of increasing complaints of electrical malfunctions caused by electromagnetic interference. Examples include TV snow, flight instrument malfunctions caused by pocket calculators and activation of electrically controlled devices by citizen band radios.

Methods presently used to shield electronic components have been ranked in order of preference. The methods, in order of preference, include silver paint application, nickel paint application, conductive filler utilization, silver reduction, cathode sputtering, foil application, copper paint, vacuum metalizing, electroplating, flame/arc spraying and graphite paint application. With the exception of conductively filled plastics, all of the shielding methods suffer from either a limited life due to chipping, cracking, peeling or the fact that they involve costly secondary operations.

The most desirable method of shielding is with conductively filled plastic because the shielding material is an integral part of the plastic and will not chip or blister and does not require a secondary operation. However, incorporating conductive fillings in plastics frequently reduces product properties in an unacceptable extent because of the high amount of filler required to provide acceptably high shielding characteristics.

OBJECTS OF THE INVENTION

It is an object of this invention to provide a fiber reinforcement for polymer components which imparts superior mechanical properties.

It is another object of the invention to provide a polymer sheet containing the fiber reinforcement which exhibits good mechanical properties.

It is yet another object of the invention to be able to use lesser amounts of conductive filler in a polymer sheet without reducing shielding effectiveness.

It is still a further objective of this invention to provide a process for forming a conductive fiber mat which is easily processed and provides good properties when incorporated into a polymer sheet.

STATEMENT OF THE INVENTION

In accordance with the first embodiment of the invention, there is provided a fiber mat suitable for deploying as an EMI shield in a polymer matrix. The mat comprises a first layer formed from a nonwoven reinforcing fiber and a second layer carried by the first layer comprising metal whiskers or fibers formed from a ductile metal or metal alloy. By using these metal whiskers or fibers in a second layer, low metal concentrations are possible in the final product because of the high aspect ratio (1/d) of the fiber. By carrying the metal whiskers on the reinforcing mat the second layer can be present in an amount which would otherwise be inadequate to provide sufficient structural integrity for independent handling.

In another aspect of the invention, the above described two layer mat is incorporated into a polymer matrix to form a composite. The resulting composite is suitable for use as panels and the like requiring EMI shielding. The nonwoven layers of fiber are flowable under stamp molding conditions and thus the composite is highly suitable for use as stampable sheet or sheet molding compound.

In another aspect of the invention, a conductive mat suitable for use in a polymer matrix to provide good mechanical properties and EMI shielding is provided by a process comprising conveying a mat of nonwoven fabric beneath a distributor of metal whiskers and distributing metal whiskers onto the mat from the distributor in an amount sufficient to impart conductivity to the resultant blend. The procedure provides advantages in (1) ease of fabrication and economy in the use of conductive material (2) ease of handling of the resulting two component mat.

DETAILED DESCRIPTION OF THE INVENTION

In accordance with a first embodiment of the invention, a fiber mat suitable for incorporating into a polymer or resin to provide reinforcement and EMI shielding therein comprises a first layer and a second layer. The first layer comprises a nonwoven reinforcing fiber mat. Conventional reinforcing fibers can be used if desired, the exact type depending on the properties desired to be imparted to the matrix and cost. Nonwoven fiberglass mat is presently preferred since it is readily available and inexpensive, especially fiberglass in which the fiber is continuous because of the resulting properties in the composite although chopped glass or chopped or continuous carbon fiber can be used if desired. Carbon fibers, either chopped or continuous, also provide a desirable alternative.

The second layer of the mat is carried on the first layer and comprises nonwoven metal whiskers or fibers of a ductile conductive metal or metal alloy. Preferably, the metal whiskers have a sufficient length to diameter ratio (aspect ratio) so as to provide good EMI shielding at a low concentration. To provide good EMI shielding it is important that a sufficient amount of the metal whiskers be deposited on the nonwoven reinforcing fiber mat so that a conductive network is formed and that the deposit be sufficiently dense to yield the desired degree of EMI shielding. Normally, the second layer will provide a screen on top of the first layer that can be seen through since the wavelengths to be shielded are generally greater than 30 centimeters. Open areas defined by interconnected individual whiskers on the first layer of up to about one square centimeter are thus satisfactory. Various ductile conductive metals or metal alloys are suitable for forming the whiskers. The metals which can be used for electrical conductors are suitable, such as for example, aluminum, copper, silver, or gold. Other metals, such as nickel, tin, and lead are also expected to work well, provided that the resins selected does not interact with the metal selected, such as by corrosion.

TABLE I-continued
Properties of Polyphenylene Sulfide (PPS)—Glass Fibers - Aluminum Fibers Composites

| | | | | | | | | |
|---|---|---|---|---|---|---|---|---|
| Flexural Modulus[e] ($\times 10^6$ psi) | 1.45 | 1.35 | 1.29 | 1.33 | 1.12 | 1.34 | 1.3 | 0.8 |
| Notched Izod[f] (ft-lb/in) | 14.0 | 16.7 | 16.6 | 13.0 | 11.8 | 14.8 | 12.6 | 0.8 |
| Unnotched Izod[g] (ft-lb/in) | 25.0 | 29.6 | 25.6 | 27.0 | 21.3 | 22.3 | 19.0 | 3.2 |
| Heat Deflection[h] Temperature, °C. @ 264 psi | 273 | 252 | 271 | 266 | 101 | 272 | 244 | 176 |
| Elongation (%)[i] | 1.9 | 2.49 | 2.35 | 1.52 | 2.05 | 4.3 | 1.24 | 2.7 |
| EMI Shielding[j] from 0.1–1000 MHz | — | 26–35 | 38–45 | 32–55 | 46–41 | 57–54 | | 62–69[b] |

[a]Continuous aluminized glass - supplied by
[b]0.5–1000 MHz
[c]ASTM D-638
[d]ASTM D-790
[e]ASTM D-790
[f]ASTM D-256
[g]ASTM D-256
[h]ASTM D-648
[i]ASTM D-638
[j]ASTM ES 7-83

EXAMPLE 3
Polypropylene (PP)-Glass Fiber Composite

The procedure was the same as in Example 1 except that polypropylene was used and a molding temperature of 500° F. was used. The properties of the composite are shown in Table II.

EXAMPLE 4
PP-Glass Fiber-Aluminum Fiber Composite

The procedure was the same as in Example 2 except that PP was used and a molding temperature of 500° F. was used. The properties of the composite are shown in Table II. At the 33 percent glass fiber—17 percent Al fiber loading the EMI shielding is very good and the change in physical properties due to the addition of the Al fiber is within acceptable limits.

EXAMPLE 5
Polyethylene Terephthalate (PET)-Glass Fiber Composite

The procedure was the same as in Example 1 except that PET was used and the molding temperature was 525° F. Properties are shown in Table II.

EXAMPLE 6
PET-Glass Fiber-Aluminum Fiber Composite

The procedure was the same as in Example 2 except that PET was used and the molding temperature was 525° F. Properties are shown in Table II.

TABLE II
Properties of Other Polymer - Glass Fibers - Aluminum Fibers Composites

| Polymer | PP | PP | PET | PET |
|---|---|---|---|---|
| Glass Fibers (%) | 40 | 33 | 40 | 33 |
| Al Fibers (%) | 0 | 17 | 0 | 17 |
| Resin | 60 | 50 | 60 | 50 |
| Tensile Strength ($\times 10^3$ psi) | 16.7 | 12.6 | 31.2 | |
| Flexural Strength ($\times 10^3$ psi) | 14.9 | 12.3 | 44.2 | |
| Flexural Modulus ($\times 10^6$ psi) | 0.6 | 0.67 | 1.2 | |
| Notched Izod (ft-lb/in) | 20.9 | 19.3 | 21.0 | |
| Unnotched Izod (ft-lb/in) | 27.9 | 24.4 | 34.6 | |
| Heat Deflection Temperature °C. | 156 | 156 | 254 | |
| Elongation (%) | 2.6 | 1.57 | 2.26 | |
| EMT Shielding from 0.1–1000 MHz | — | 60–47 | — | 47–53 |

EXAMPLE 7
Preparation of Aluminum Fiber on Glass Mat

Transmet Corp., (Columbus, Ohio) a producer of aluminum fibers using a spinning wheel and quick quench method, STET produced aluminum fibers deposited directly onto a glass mat at 0.5 oz/ft² and 1.0 oz/ft². This aluminum fiber-glass fiber mat was used without further treatment.

That which is claimed is:

1. Composition comprising:
   (a) a mat of non-metallic reinforcing fibers; and
   (b) a distribution of nonwoven metal whiskers or fibers of a ductile conductive metal or metal alloy carried on the mat.

2. A composition as in claim 1 wherein continuous glass fibers form the mat and the metal whiskers have a length in the range of about 0.5 to about 20 cm.

3. A composition as in claim 2 wherein the metal whiskers comprise aluminum fibers having a length a major portion of which is within the range of 1–10 cm.

4. A composition as in claim 2 further comprising a polymer matrix encasing the mat of non-metallic reinforcing fibers and the distribution of nonwoven metal whiskers or fibers.

5. A composition as in claim 4 wherein the polymer matrix is formed from a thermoplastic resin or thermoset resin having a crystalline character.

6. A composition as in claim 5 wherein the polymer matrix comprises a thermoplastic resin.

7. A composition as in claim 6 which is in the form of a sheet and the polymer comprises polypropylene resin.

8. A composition as in claim 6 further characterized by EMI shielding of at least 40 dB.

9. A composition as in claim 6 further characterized by EMI shielding of at least 50 dB.

10. A composition as in claim 6 wherein the polymer matrix comprises poly(phenylene)sulfide and the metal whiskers are formed from aluminum.

11. A composition as in claim 10 further characterized by a weight ratio of glass fiber to aluminum whiskers in the range of 4:1 to 1:1.

12. A composition as in claim 10 further characterized by a weight ratio of glass fiber to aluminum whiskers in the range of 3:1 to 1:1.

13. A composition as in claim 12 characterized by in the range of 25 to 75 weight percent polyphenylene sulfide matrix material.

14. A composition as in claim 12 characterized by in the range, of 40–60 weight percent polyphenylene sulfide matrix material.

15. A process for forming a conductive mat suitable for use in a polymer matrix to provide improved mechanical properties and EMI shielding, said process comprising:

(a) conveying a mat of nonwoven fabric beneath a distributor of molten metal;

(b) distributing molten metal from the distributor and forming metal whiskers; and (c) depositing said whiskers on said mat in an amount sufficient to impart conductivity to the mat.

16. A process as in claim 15 wherein the mat is formed from nonwoven glass fibers and the metal whiskers contain aluminum.

17. A process as in claim 16 wherein the glass fibers are continuous and the metal whiskers have a length of 0.5–20 cm.

18. A process as in claim 17 wherein the metal whiskers are distributed on the nonwoven mat in an amount sufficient to impart to the conductive mat in the range of 25–50 wt% metal.

19. A process as in claim 18 wherein a major portion of the metal whiskers have a length in the range of 1.0–10 cm.

* * * * *